US012314102B2

(12) United States Patent
Nasr Azadani et al.

(10) Patent No.: US 12,314,102 B2
(45) Date of Patent: May 27, 2025

(54) ALLOCATING POWER BETWEEN OVERHEAD, BACKUP, AND COMPUTING POWER SERVICES

(71) Applicant: Microsoft Technology Licensing, LLC, Redmond, WA (US)

(72) Inventors: Ehsan Nasr Azadani, Sammamish, WA (US); Alok Gautam Kumbhare, Sammamish, WA (US); Mark Alan Monroe, Louisville, CO (US); Osvaldo P. Morales, Normandy Park, WA (US); Christian L. Belady, Mercer Island, WA (US); Kyle Woolcock, Redmond, WA (US); Ricardo Gouvêa Bianchini, Bellevue, WA (US); Winston Allen Saunders, Seattle, WA (US); Lalu Vannankandy Kunnath, Snoqualmie, WA (US); Rodrigo Lemos de Assis, Kirkland, WA (US); Brijesh Warrier, Bellevue, WA (US); Marcus Felipe Fontoura, Medina, WA (US); Sean Patrick Abbott, Redmond, WA (US); David Thomas Gauthier, Seattle, WA (US); Ashish Raniwala, Parkland, FL (US); Nithish Mahalingam, Sammamish, WA (US); Brian Addams Janous, Issaquah, WA (US); Upshur Bagwell Quinby, V, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/849,054

(22) Filed: Jun. 24, 2022

(65) Prior Publication Data
US 2023/0418347 A1 Dec. 28, 2023

(51) Int. Cl.
*G06F 1/26* (2006.01)
*G05B 19/042* (2006.01)
(Continued)

(52) U.S. Cl.
CPC ............. *G06F 1/26* (2013.01); *G05B 19/042* (2013.01); *G05B 2219/2639* (2013.01); *G06F 1/189* (2013.01); *G06F 9/505* (2013.01)

(58) Field of Classification Search
CPC . G06F 1/26; G06F 1/189; G06F 9/505; G05B 19/042; G05B 2219/2639
(Continued)

(56) References Cited

U.S. PATENT DOCUMENTS 8,487,473 B2 7/2013 Wirtz et al.
9,563,216 B1 * 2/2017 Barroso .................... G05F 1/66
(Continued)

FOREIGN PATENT DOCUMENTS

WO 2019154739 A1 8/2019

OTHER PUBLICATIONS

Zheng, et al., "TE-Shave: Reducing Data Center Capital and Operating Expenses with Thermal Energy Storage", In Journal of IEEE Transactions on Computers, vol. 64, Issue 11, Nov. 1, 2015, pp. 3278-3292.
(Continued)

*Primary Examiner* — Ji H Bae
(74) *Attorney, Agent, or Firm* — RAY QUINNEY & NEBEKER P.C.; Paul N. Taylor

(57) ABSTRACT

A power controller allocates input power to a datacenter between computing power for computing services, backup power, and overhead power for overhead systems. The power controller reallocates the overhead power and/or the backup power to the computing power. This may increase
(Continued)

the overall utilization of the datacenter by allowing additional processing power of the servers to be used.

14 Claims, 9 Drawing Sheets

(51) Int. Cl.
  *G06F 1/18* (2006.01)
  *G06F 9/50* (2006.01)
(58) Field of Classification Search
  USPC .......................................................... 713/300
  See application file for complete search history.

(56) References Cited

U.S. PATENT DOCUMENTS

| | | |
|---|---|---|
| 11,146,099 B2 | 10/2021 | Malone |
| 11,163,280 B2 | 11/2021 | Henson et al. |
| 2010/0211804 A1 | 8/2010 | Brumley et al. |
| 2013/0086404 A1* | 4/2013 | Sankar ................... G06F 1/305 |
| | | 713/320 |
| 2015/0234440 A1* | 8/2015 | Gardner ............... H05K 7/1492 |
| | | 713/300 |
| 2016/0116961 A1* | 4/2016 | Kunnathur Ragupathi ................. |
| | | G06F 1/3203 |
| | | 713/320 |
| 2016/0170469 A1* | 6/2016 | Sehgal .................. G06F 1/3206 |
| | | 713/320 |
| 2017/0195408 A1* | 7/2017 | Wu ....................... G06F 1/3203 |
| 2019/0041931 A1 | 2/2019 | Bedare et al. |
| 2020/0100394 A1 | 3/2020 | Albinger et al. |
| 2020/0394081 A1 | 12/2020 | Manousakis et al. |
| 2021/0294406 A1 | 9/2021 | Broadbent et al. |
| 2022/0087075 A1 | 3/2022 | Heydari et al. |

OTHER PUBLICATIONS

"International Search Report and Written Opinion Issued in PCT Application No. PCT/US23/022630", Mailed Date: Sep. 29, 2023, 11 Pages.

* cited by examiner

ALLOCATING POWER BETWEEN OVERHEAD, BACKUP, AND COMPUTING POWER SERVICES

CROSS-REFERENCE TO RELATED APPLICATIONS

N/A.

BACKGROUND

Datacenters often including multiple servers arranged into racks. A single datacenter may include multiple racks. The servers may operate a virtual machine, which may perform remote computing activities for one or more clients. The servers consume power based on a utilization of the server. The utilization may be based on the configuration of the virtual machine. For example, a virtual machine may be arranged as a compute node, which may utilize increased computing power and therefore an increased power consumption. In some situations, the utilization of the datacenter (e.g., the amount of computing capacity used by the datacenter) may be based on the power supply into the datacenter. For example, a processor may be limited by the amount of power provided to it.

A datacenter may allocate input power to various services at the datacenter. For example, at least a portion of the input power may be allocated to provide power to the computing system. Some of the input power may be allocated to provide power to overhead systems (such as lighting, HVAC, cooling, and so forth) of the datacenter. Some of the input power may be allocated to maintain backup power for the computing system.

BRIEF SUMMARY

In some aspects, the techniques described herein relate to a method for power allocation, including determining a power allocation for a computing system, the power allocation including a computing power allocation, a power redundancy allocation, and an overhead power allocation. The method includes determining a computing load on the computing system and reallocating at least a portion of the overhead power allocation based on the computing load.

In some aspects, the techniques described herein relate to a power allocation system for a datacenter, including one or more computing systems having a computing capacity. The power allocation system includes an input power, the input power being allocated between a computing power allocation configured to provide power to the one or more computing systems, a first portion of the input power being allocated for computing power of the one or more computing systems and a second portion of the computing power allocation being allocated for backup power and an overhead power allocation. A power controller is configured to reallocate at least a portion of the overhead power allocation to the computing power allocation based on an additional computing capacity of the one or more computing systems.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 4-1 through FIG. 4-5 show power consumption graphs at a datacenter, according to at least one embodiment of the present disclosure;

FIG. 5 is a representation of a schematic power allocation system for a datacenter, according to at least one embodiment of the present disclosure;

DETAILED DESCRIPTION

Figure 1:
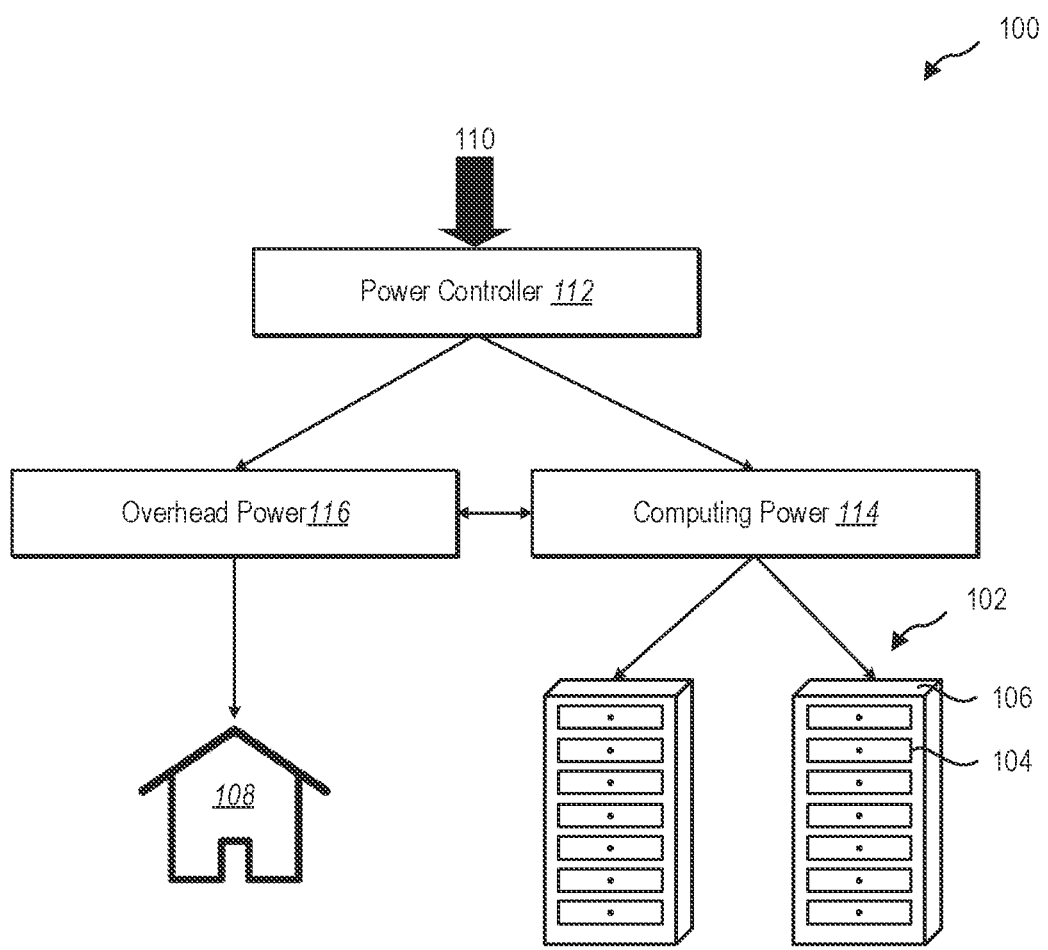
FIG. 1 is a representation of a power allocation system, according to at least one embodiment of the present disclosure.

This disclosure generally relates to devices, systems, and methods for power management and allocation at a datacenter. Datacenters use power to operate computing devices (such as racks, servers, virtual machines, storage, and so forth) and to operate overhead equipment, such as lights, HVAC, computing cooling systems, and so forth. A power controller allocates input power to the various elements of the datacenter. For example, the power controller may allocate a portion of a backup power to be utilized as computing power. The power controller may allocate a portion of the overhead power to other uses. For example, the power controller may allocate a portion of the overhead power as computing power. In some examples, the power controller may allocate a portion of energy storage such as a battery in back up power back to the power grid. This may allow for an increased utilization of input power.

In accordance with at least one embodiment of the present disclosure, the power controller may allow the datacenter to utilize a higher percentage of the input power to the datacenter for computing resources. The computing system may have an increased computing demand, which may utilize additional power. As discussed in further detail herein, to meet the increased computing demand, the power controller may reallocate at least a portion of the overhead power to the computing devices. For example, the power controller may reallocate power from the HVAC system to meet the increased computing demand. In some examples, the power controller may reallocate power from the computing cooling system to meet the increased computing demand. This may increase the computing capacity of the datacenter.

In some embodiments, the power controller may reallocate a portion of the overhead power for computing purposes. For example, the overhead power may include an allocation for recharging batteries of an uninterruptable power supply (UPS). When the UPS batteries are fully charged, the power allocation may be unutilized, and the power controller may reallocate the power for computing purposes. This may help to reduce the amount of unused power at the datacenter.

In some embodiments, the power controller may receive input power source information, and allocate power based on the input power source information. For example, the power controller may determine that the input power is provided primarily by a particular power source (e.g., renewable power, nuclear power, fossil-fuel power), and the power controller may increase or decrease the computing device utilization. This may allow the datacenter flexibility to operate based on the power source. In some examples, the power controller may determine the price of power at a particular time and allocate power based on the price of power. For example, if the price of power is low, then the utilization of the datacenter (and associated power consumption) may be increased. If the price of power is high, then the power controller may sell generated or stored power back to the power grid. This may increase the flexibility of operation of the datacenter.

As illustrated by the foregoing discussion, the present disclosure utilizes a variety of terms to describe features and advantages of the power allocation system. Additional detail is now provided regarding the meaning of such terms. For example, as used herein, the term "computing power" refers to power utilized by computing devices for computing purposes. In particular, the term computing power can include power used to operate processors or servers of a datacenter. The servers may operate a virtual machine in compute mode, storage mode, any other mode, and combinations thereof. In some embodiments, the computing power may be used to supply power to a power supply unit (PSU), an uninterruptable power supply (UPS), backup power, a direct power line to the server, any other server power, and combinations thereof.

The term "backup power" may refer to power that is used to provide power to computing services in the event that at least a portion of the input power is disconnected from the computing services and/or the servers. In some embodiments, the backup power may be a separate power system, such as backup power generators, batteries, or other backup power system.

In some embodiments, a portion of the input power may be allocated as a power redundancy. The power redundancy may be a reservation of the total power supply to the UPS or other input power system.

The term "overhead power" refers to the power used for overhead systems, or non-computing power services at a datacenter. For example, overhead power may refer to the lighting, heating, ventilation, and air conditions (HVAC), plumbing, administration, computing cooling system, UPS charging, reservations for power losses, any other overhead power, and combinations thereof.

FIG. 1 is a representation of an environment of a power allocation system 100, according to at least one embodiment of the present disclosure. The power allocation system 100 may be located at a datacenter 102, a colo (e.g., a colocation facility), or other system that includes one or more servers 104. In some embodiments, the datacenter may be a remote computing facility. A plurality of servers 104 may be arranged into racks 106. The servers 104 may operate one or more virtual machine, which may provide services for clients, such as computing services, storage services, and so forth.

The datacenter 102 may further include overhead systems 108. As discussed herein, the overhead systems 108 may include services that are used in support of the datacenter 102. For example, the overhead systems 108 may include lighting, HVAC, computing cooling systems, battery charging, and so forth. In some embodiments, any losses associated with non-operational or not-currently prioritized equipment may include a backup service. In some embodiments, the overhead systems 108 may include any consumer of power that is not utilized for computing purposes. In some embodiments, power distribution redundancies may be included in the overhead systems 108.

The power allocation system 100 may include an input power source 110. The input power source 110 may be the input power to the datacenter 102. The input power source 110 may come from the power grid. For example, the input power source 110 may be supplied by a utility company or other power source. In some embodiments, the input power source 110 may be supplied on site, such as by generators, a site-based power plant, solar panels, and so forth. In some embodiments, the input power source 110 may include multiple input power lines, based on different sources and/or to provide increased reliability.

The input power source 110 may be allocated to various services within the datacenter 102 using a power controller 112. The power controller 112 may allocate input power from the input power source 110 to the servers 104 and/or to the overhead systems 108. For example, the input power from the input power source 110 may have a total wattage, or a total amount of Watts that may be utilized to power the datacenter 102. The power controller 112 may allocate a first portion of the total wattage to the servers 104 through one or more UPS as a computing power 114 allocation. As will be discussed in further detail herein, the power controller 112 may allocate a portion of input power as a power redundancy allocation. In some embodiments, the power redundancy allocation may include a portion of input power used to maintain a compute power redundancy and overhead power requirements. For example, the power controller 112 may reserve a portion of the total power of the computing power 114 allocation for the power redundancy allocation, to be utilized if another UPS loses functionality. The power controller 112 may allocate a second portion of the total wattage to the overhead systems 108 as overhead power 116. In this manner, the power controller 112 may help to provide the servers 104 and/or the overhead systems 108 with power for their respective services.

In accordance with at least one embodiment of the present disclosure, the power controller 112 may allocate power from the overhead power 116 to the computing power 114 allocation. In some situations, the portion of the total wattage allocated for overhead power 116 may not be utilized. For example, weather conditions may allow the administrative facility and/or the warehouse housing the racks 106 to operate without HVAC services and/or lighting. If the HVAC services and/or lighting are not used, then the portion of the overhead power 116 allocated for these services may not be used. To reduce the amount of unused input power, the power controller 112 may reallocate the portion of the overhead power 116 allocated for HVAC and/or lighting services to computing power 114. This may allow the servers 104 to operate at a higher utilization and/or allow more servers 104 to be used.

In some embodiments, the power controller 112 may perform trade-offs to determine the power allocation between the overhead power 116 and the computing power 114. For example, client requests may increase the workload on the servers 104. The power controller 112 may determine that one or more of the overhead systems 108 may be temporarily suspended. The power controller 112 may reallocate power from the suspended services to the computing power 114 allocation. When the increased workload has been completed or reduced, or when the suspended services are resumed, the power controller 112 may reallocate the power back to the overhead power 116.

As an example, a computing cooling system may be used to maintain the servers 104 at an operating temperature. Absent the computing cooling system, the servers 104 may not immediately increase in temperature, but the increase in temperature may be gradual. Furthermore, the computing cooling system may include a tank or other reservoir of chilled cooling fluid. During a period of increased workload on the servers 104, the computing cooling system may be suspended and the power for the computing cooling system may be reallocated to the computing power 114 allocation. When one or more of the increased workload has been completed, the temperature of the servers 104 has increased above a threshold, and the computing cooling system runs out of chilled cooling fluid, the power controller 112 may reallocate the computing cooling system power back from the computing power 114 to the overhead power 116.

In some embodiments, the power controller 112 may receive a request for more computing capacity, and therefore more computing power 114. For example, the datacenter 102 may receive an increased demand for computing services. The datacenter 102 may request additional computing capacity and/or computing power 114 from the power controller 112. Based on the request, the power controller 112 may reallocate at least a portion of the overhead power 116 to the computing power 114 to meet the request for additional power.

In some embodiments, the power controller 112 may allocate power based on the input power source 110. For example, certain clients may desire their computing power 114 to be supplied using a certain type of input power source 110, such as renewable power (e.g., solar power, wind power, hydroelectricity, geothermal power), fossil fuel power (e.g., coal, natural gas), nuclear power, any other type of input power source 110, and combinations thereof. In some embodiments, the power controller 112 may allocate power based on a power price. For example, power prices may fluctuate throughout the day and/or across different days. The power controller 112 may allocate power to charge batteries or perform other tasks when power prices are low. In some embodiments, the power controller 112 may utilize secondary power sources, such as on-site generators, when power prices are higher than the power generation prices. In some embodiments, the power controller 112 may send power back to the power grid to profit off of high grid power prices. In some embodiments, the power controller 112 may make power allocation choices based on a carbon or water impact of a particular power source. For example, the power controller 112 may choose a low-carbon impact power source for battery charging. In some embodiments, the power controller 112 may make choices for input based on a balance of inputs, including energy prices, carbon impact, water impact, weather, compute spot market, external factors (grid energy storage), any other input, and combinations thereof.

Figure 2:
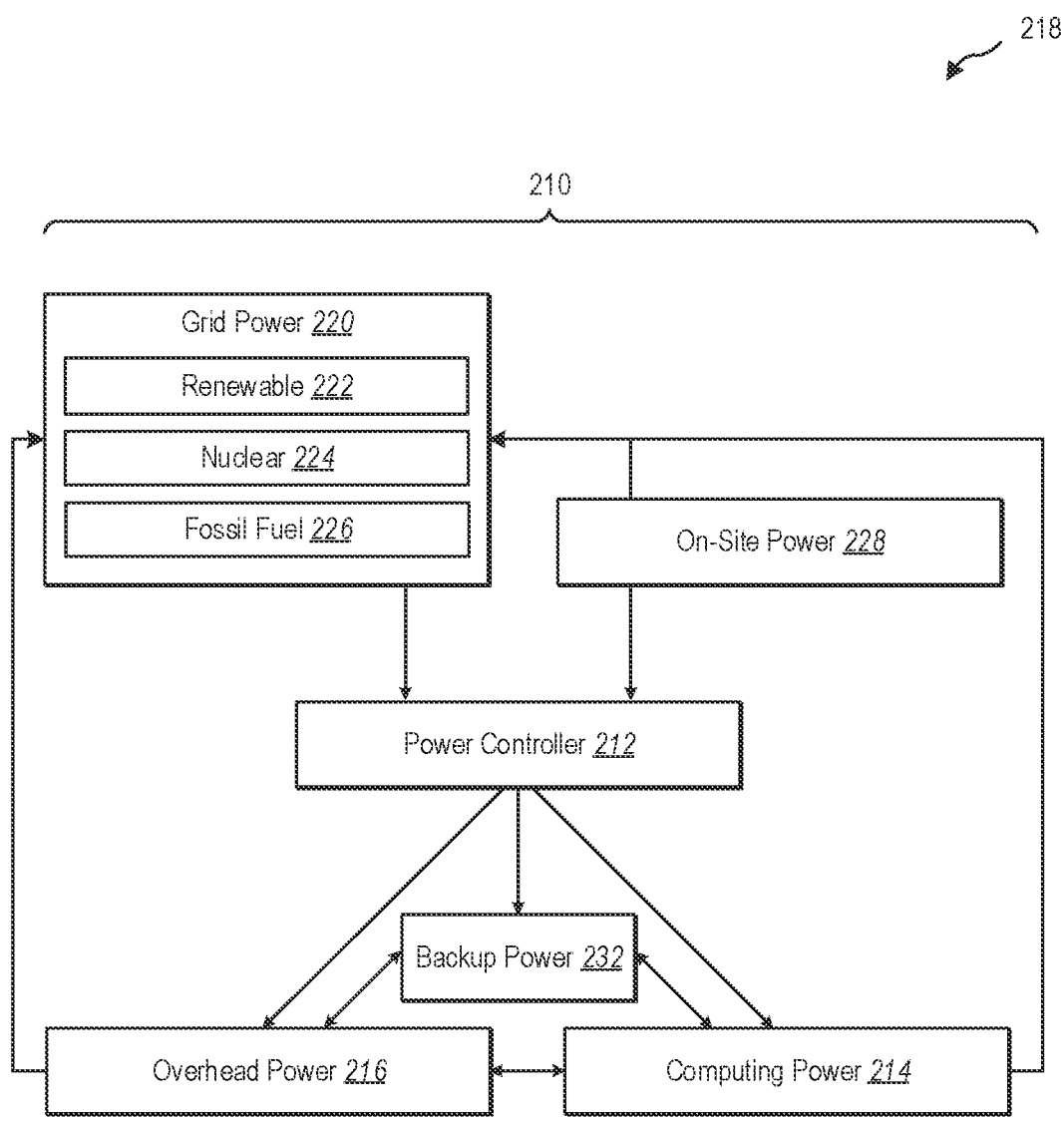
FIG. 2 is a representation of a power diagram for a power allocation system, according to at least one embodiment of the present disclosure.

FIG. 2 is a representation of a power diagram 218 for a power allocation system (e.g., the power allocation system 100 of FIG. 1), according to at least one embodiment of the present disclosure. The power diagram 218 may include one or more input power sources 210. The one or more input power sources 210 may provide power to a power controller 212. The power controller 212 may allocate power to computing power 214 and overhead power 216 for operation of the datacenter.

In some embodiments, the input power sources 210 may include grid power 220. The grid power 220 may include any type of power source used to supply a general electric grid. For example, the grid power 220 may include renewable power 222, nuclear power 224, fossil fuel power 226, any other grid power source, and combinations thereof. In some embodiments, the one or more input power sources 210 may further include on-site power 228. On-site power 228 may include any type of on-site power, such as diesel- or gas-powered generators, solar panels, power storage (e.g., batteries), any other type of on-site power 228, and combinations thereof.

The power controller 212 may allocate power from the grid power 220 and/or the on-site power 228 to the operation of the datacenter, including allocating power to one or more of the computing power 214, backup power 232, and the overhead power 216. In some embodiments, as discussed herein, the power controller 212 may allocate power from the overhead power 216 to the computing power 214, based on a utilization of the overhead power 216. In some embodiments, the power controller 212 may allocate power from on-site power 228 to the computing power 214 and/or the overhead power 216. In some embodiments, the power controller 212 may allocate power from grid power 220 to the computing power 214 and/or the overhead power 216, based on one or more of the supply from the renewable power 222, the nuclear power 224, and the fossil fuel power 226.

As discussed herein, in some embodiments, the power controller 212 may allocate at least a portion of the overhead power 216 back to the grid power 220, or the power controller 212 may reallocate at least a portion of overhead power through energy stored in back up power devices back to the power grid. For example, the power controller 212 may sell stored power allocated to the overhead power 216 back to the grid. In some embodiments, the power controller 212 may allocate at least a portion of the overhead power 216 back to the grid power 220. For example, the power controller 212 may sell power allocated to the overhead power 216 back to the grid. In some embodiments, the power controller 212 may allocate at least a portion of the on-site power 228 to the grid power 220. For example, the power controller 212 may sell power generated on-site to the grid.

The power controller 212 may utilize any input to determine the allocation of power between one or more of the overhead power 216, computing power 214, on-site power 228, and the grid power 220. For example, the power controller 212 may maximize the utilization of computing resources of the datacenter. The datacenter may have a variable computing load, based on client needs, consumer patterns, number of clients, and so forth. The power controller 212 may analyze the computing load and allocate power to the computing power 214 to increase the capacity of the datacenter.

In some examples, the power controller 212 may maximize the profitability of the datacenter by monitoring the operational cost of the datacenter, the cost of electricity of grid power 220, the cost of power generation of on-site power 228, the utilization of the computing devices, the utilization of overhead systems powered by overhead power 216, any other cost information, and combinations thereof. Monitoring cost information may help to allocate power throughout the power diagram 218. In some embodiments, the power controller 212 may make power allocation choices based on a carbon or water impact of a particular power source. For example, the power controller 212 may choose a low-carbon impact power source for battery charging. In some embodiments, the power controller 212 may make choices for input based on a balance of inputs, including energy prices, carbon impact, water impact, weather, compute spot market, external factors (grid energy storage), any other input, and combinations thereof.

In some embodiments, the power controller 212 may receive a request for more computing capacity, and therefore more computing power 214. For example, the datacenter may receive an increased demand for computing services. The datacenter may request additional computing capacity and/or computing power 214 from the power controller 212. Based on the request, the power controller 212 may reallocate at least a portion of the overhead power 216 (such as by suspending one or more overhead systems) to the computing power 214 to meet the request for additional power.

Figure 3:
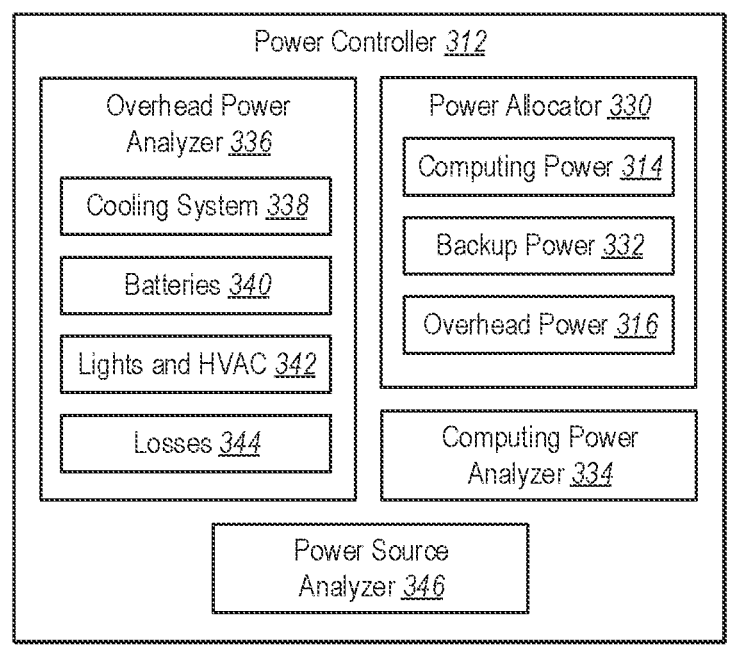
FIG. 3 is a representation of a power controller, according to at least one embodiment of the present disclosure.

FIG. 3 is a representation of a power controller 312, according to at least one embodiment of the present disclosure. Each of the components of the power controller 312 can include software, hardware, or both. For example, the components can include one or more instructions stored on a computer-readable storage medium and executable by processors of one or more computing devices, such as a client device or server device. When executed by the one or more processors, the computer-executable instructions of the power controller 312 can cause the computing device(s) to perform the methods described herein. Alternatively, the components can include hardware, such as a special-purpose processing device to perform a certain function or group of functions. Alternatively, the components of the power controller 312 can include a combination of computer-executable instructions and hardware.

Furthermore, the components of the power controller 312 may, for example, be implemented as one or more operating systems, as one or more stand-alone applications, as one or more modules of an application, as one or more plug-ins, as one or more library functions or functions that may be called by other applications, as a cloud-computing model, or combinations thereof. Thus, the components may be implemented as a stand-alone application, such as a desktop or mobile application. Furthermore, the components may be implemented as one or more web-based applications hosted on a remote server. The components may also be implemented in a suite of mobile device applications or "apps."

The power controller 312 includes a power allocator 330. The power allocator 330 may allocate the input power into the datacenter between the services at the datacenter. For example, the power allocator 330 may allocate power between a computing power 314 allocation, a backup power 332 allocation, and an overhead power 316 allocation. The power controller 312 includes a computing power analyzer 334. The computing power analyzer 334 may analyze and/or predict the utilization of the servers and other computing systems of the datacenter. Using the utilization, the computing power analyzer 334 may determine the power consumption of the servers and computing devices.

The power controller 312 includes an overhead power analyzer 336. The overhead power analyzer 336 may analyze the power utilization of one or more overhead systems that are powered by the overhead power 316. For example, the overhead power analyzer 336 may analyze the power utilization of the cooling system 338 of the datacenter. The cooling system 338 may be any type of cooling system 338. For example, the cooling system 338 may be a fluid-cooled cooling system. The cooling system 338 may include a reservoir or tank of chilled cooling fluid (e.g., cooling fluid that is at a temperature effective for cooling the computing devices). The overhead power analyzer 336 may determine the amount of cooling that the chilled cooling fluid may perform. Based on the reservoir of chilled cooling fluid, the power allocator 330 may allocate power used by the cooling system 338 to the computing power 314. In this manner, the computing capacity of the datacenter may be increased while the chilled cooling fluid cools the computing devices. In this manner, the cooling system 338 may utilize the stored thermal energy in the cooling fluid reservoir to increase the computing capacity of the datacenter.

In some embodiments, the cooling system 338 may be any other type of cooling system. For example, the cooling system 338 may be an air-cooled or fan-based cooling system. The fans may be turned off to temporarily increase the computing capacity of the datacenter. This may cause the operating temperature of the computing devices to rise over a period of time. The computing capacity may be increased until the operating temperature of the computing devices rises above a threshold temperature, when the power allocator 330 may allocate power back to the cooling system 338 powered by the overhead power 316.

The overhead systems may include one or more batteries 340. For example, the batteries may be connected to or a part of a UPS, secondary power source, primary power source, any other battery, and combinations thereof. The batteries 340 may be charged using the overhead power 316, and the power allocator 330 may allocate input power to the overhead power 316 for this charging. Once the batteries 340 are charged, this portion of the overhead power 316 may be unused. The overhead power analyzer 336 may determine the amount of power used to charge the batteries 340. If the batteries are fully charged, then the overhead power analyzer 336 may determine that the portion of the overhead power 316 used to charge the batteries 340 may be unused. The overhead power analyzer 336 may communicate the utilization of the battery charging power to the power allocator 330. The power allocator 330 may allocate this portion of the overhead power 316 to the computing power 314, thereby increasing the computing capacity of the datacenter. In some embodiments, the power allocator 330 may allocate the power stored in the batteries 340 to the computing power 314.

The overhead power analyzer 336 may further analyze the power used by lights and HVAC 342 of administrative offices and other ancillary support facilities. Based on computing demands by the datacenter, the power allocator 330 may determine that the power allocated by the lights and HVAC 342 may be allocated to the computing power 314. In some embodiments, the overhead power analyzer 336 may use external information to determine whether the lights and HVAC 342 power may be reallocated to the computing power 314. For example, the overhead power analyzer 336 may determine that the lights and HVAC 342 may not be used on a weekend or holiday when administrative staff are not present at the datacenter. In some examples, the overhead power analyzer 336 may determine that the weather is such that the lights and HVAC 342 may not be used to maintain a comfortable working environment. In some embodiments, the overhead power analyzer 336 may analyze the power used by any other power system, including backup compute systems, network systems, redundant network devices, any other power system, and combinations thereof.

In some embodiments, the overhead power analyzer 336 may analyze the amount of overhead power 316 allocated for power losses 344 in the system. The power allocator 330 may allocate a portion of the input power to power losses 344. These power losses 344 may be losses in the electrical and power system of the datacenter. The power losses 344 may be based on the total power use of the datacenter. Put another way, as the power use goes up, the power losses 344 may go up. As power use goes down, the power losses 344 may go down. In some embodiments, based on the total amount of power used by the datacenter, the power allocator 330 may reallocate a portion of the input power allocated to power losses 344 to computing power 314 or another power system.

The power controller 312 may include a power source analyzer 346. The power allocator 330 may allocate power between the computing power 314, the backup power 332, and the overhead power 316 based on information provided by the power source analyzer 346. For example, the power source analyzer 346 may determine that the input power is being supplied by a particular source or that the input power is being provided at a particular price, and allocate the input power based on the input source. In some embodiments, the power allocator 330 may allocate more power to the overhead power 316 based on the source or the price. For example, thermal energy may be stored in the cooling system 338 and/or batteries 340 charged based on a particular power source and/or power price.

In some embodiments, the computing power analyzer 334 may identify a request for additional computing capacity and/or additional computing power 314. Based on the request for additional computing capacity, the power allocator 330 may review the overhead power allocation based on the overhead power analyzer 336. The power allocator 330 may determine the amount of additional computing capacity and/or additional computing power 314 requested. Based on the amount of additional computing capacity and/or additional computing power 314 requested, the power allocator 330 may allocate power from one or more of the cooling system 338, batteries 340, lights and HVAC 342, or power losses 344 to the computing power 314. For example, the power allocator 330 may suspend one or more of these overhead systems, such as the cooling system 338, the batteries 340, lights and HVAC 342, or power losses 344. This may help to increase the computing capacity based on requested additional capacity.

Figures 1, 4:
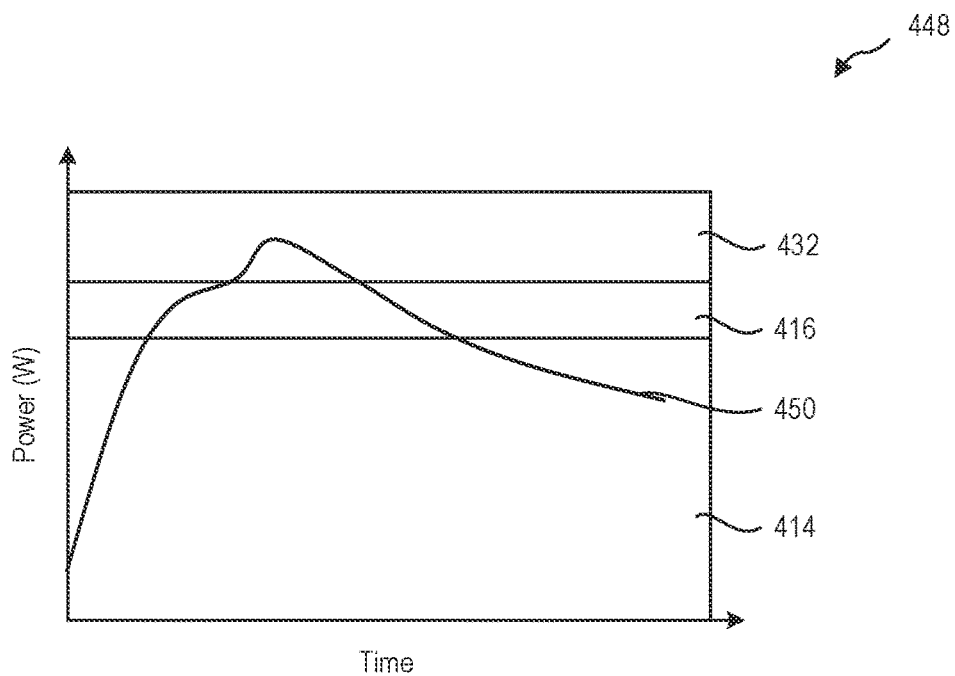
Figures 2, 4:
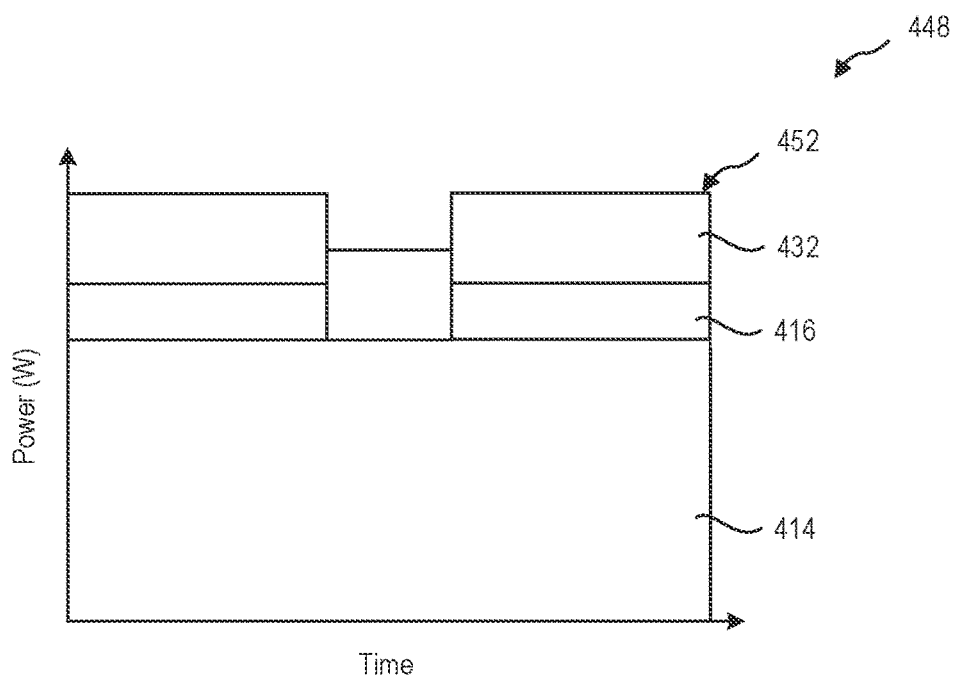
Figures 3, 4:
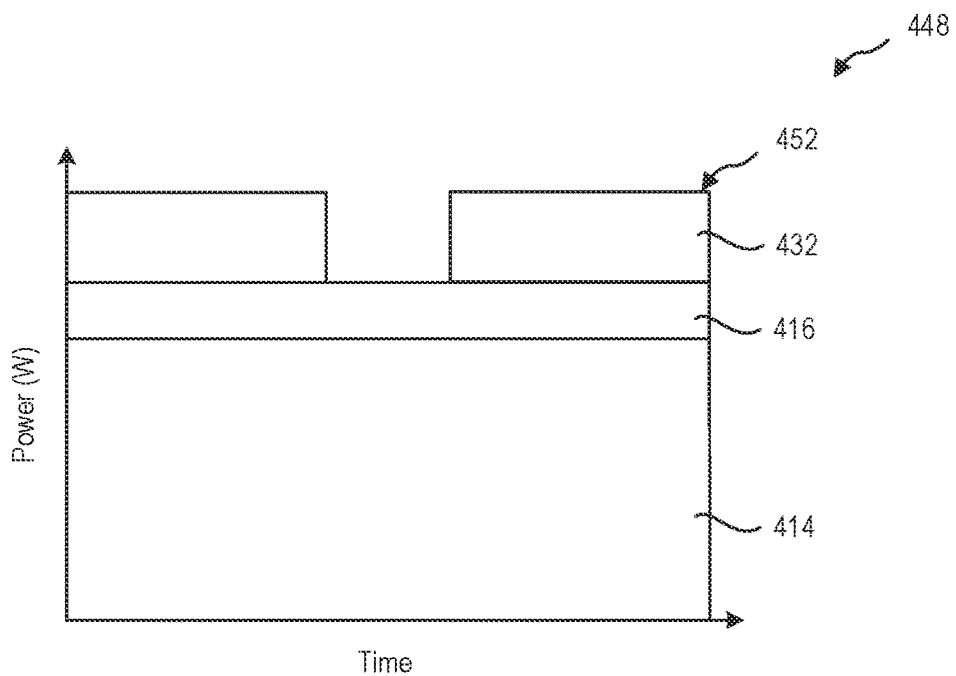
Figure 4:
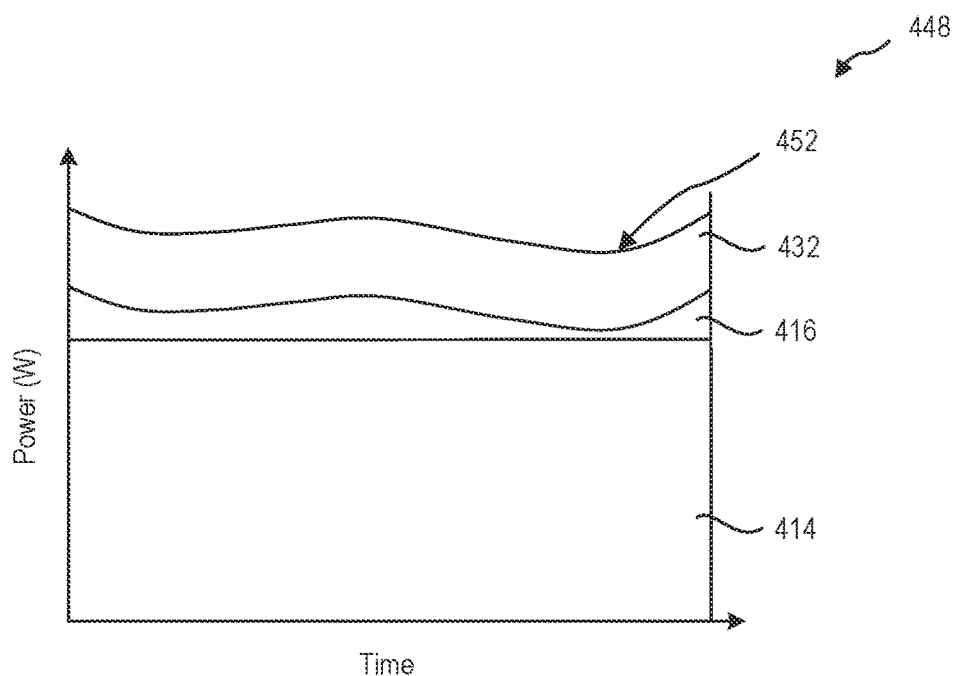

FIG. 4-1 is a power chart 448 having power on the vertical axis (e.g., y-axis) plotted against time on the horizontal axis (e.g., x-axis), according to at least one embodiment of the present disclosure. The power chart 448 includes a plurality of sections indicating power allocations, including a computing power 414 allocation, an overhead power 416 allocation, and a power redundancy 432 allocation. The power allocations may be power that is available for use by the computing system, or power that may be allocated to be used by computing services at the datacenter.

A power consumption graph 450 over time is plotted on the power chart 448. When the power consumption graph 450 is located in the overhead power 416, the power allotted to overhead power 416 may be sufficient to power the computing system. As the power consumption of the computing system increases, the power consumption graph 450 may exceed the overhead power 416 allocation. In accordance with at least one embodiment of the present disclosure, a power controller may reallocate power from one or both of the computing power 414 allocation or the power redundancy 432 allocation.

For example, in the embodiment shown in FIG. 4-1, as the power consumption increases past the overhead power 416 allocation, as indicated by the power consumption graph 450 extending out of the overhead power 416 allocation zone, the power controller may allocate a portion of the power redundancy 432 allocation to satisfy the increased power consumption.

In some embodiments, the power consumption of the computing system may exceed the combined overhead power 416 allocation and the computing power 414 allocation, as may be seen by the power consumption graph 450. When the power consumption exceeds the combined overhead power 416 allocation and computing power 414 allocation, the power controller may allocate the power redundancy 432 allocation to the computing power 414.

FIG. 4-2 is a representation of a power chart 448 in which at least a portion of the overhead power 416 is unavailable for a period of time. The power chart 448 shows a maximum power capacity 452, which may be the combined power of the overhead power 416 allocation, the computing power 414 allocation, and the power redundancy 432 allocation. As may be seen, when a portion of the input power becomes unavailable for use by the computing system, the maximum power capacity 452 may be reduced. Since the power redundancy 432 allocation is still available, the maximum power capacity 452 does not reduce all the way to the computing power 414, but only reduces by the amount of unavailable overhead power 416.

As discussed herein, the power controller may allocate the overhead power 416 to be unavailable for use by the computing system based on any factor, including time of day, a particular day, overhead system availability, power source, any other factor, and combinations thereof.

In FIG. 4-3, the power redundancy 432 is unavailable for use by the computing system for a period of time. For example, the power redundancy 432 may be used as backup power (e.g., to support one or more UPS that has lost power), the power redundancy 432 may be allocated as unavailable for use by the computing system. The overhead power 416 may still be available, and the maximum power capacity 452 may be reduced based on the unavailability of the power redundancy 432.

In FIG. 4-4, the overhead power 416 allocation available for use by the computing system may be variable. As discussed herein, the overhead power 416 allocation may be based on a plurality of overhead systems. The power controller may determine that some of the overhead systems should be used at a particular time, while others may not be used, based on the requirements of the computing system.

As may be seen, the power redundancy 432 may have a constant allocation. Put another way, the power redundancy 432 allocation may be all available or all unavailable. In this manner, as may be seen, the maximum power capacity 452 may vary based on the allocation of the overhead power 416.

Figures 4, 5:
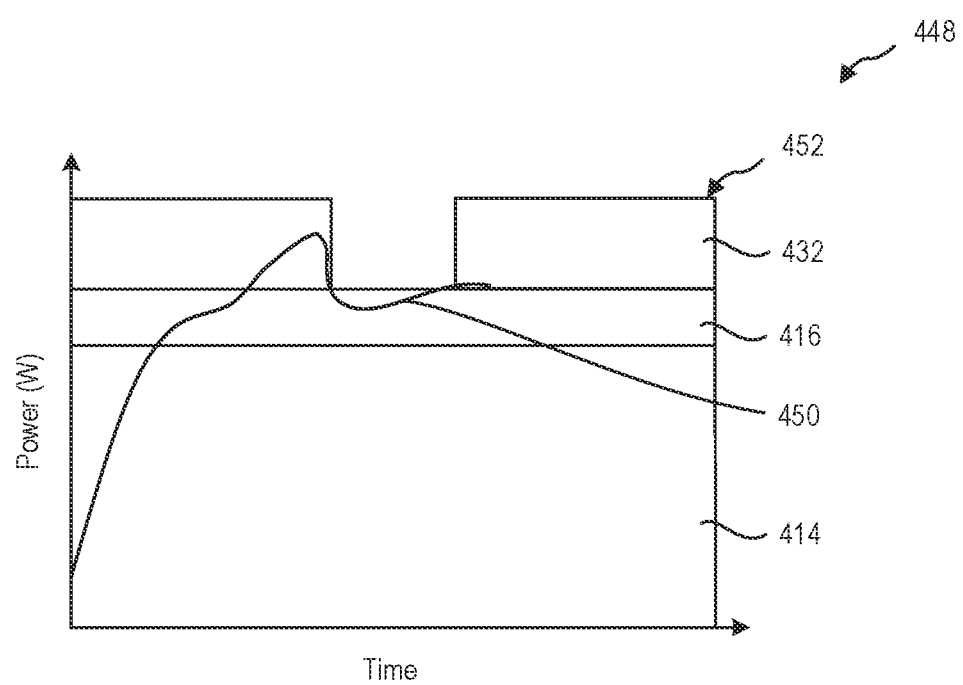
Figure 5:
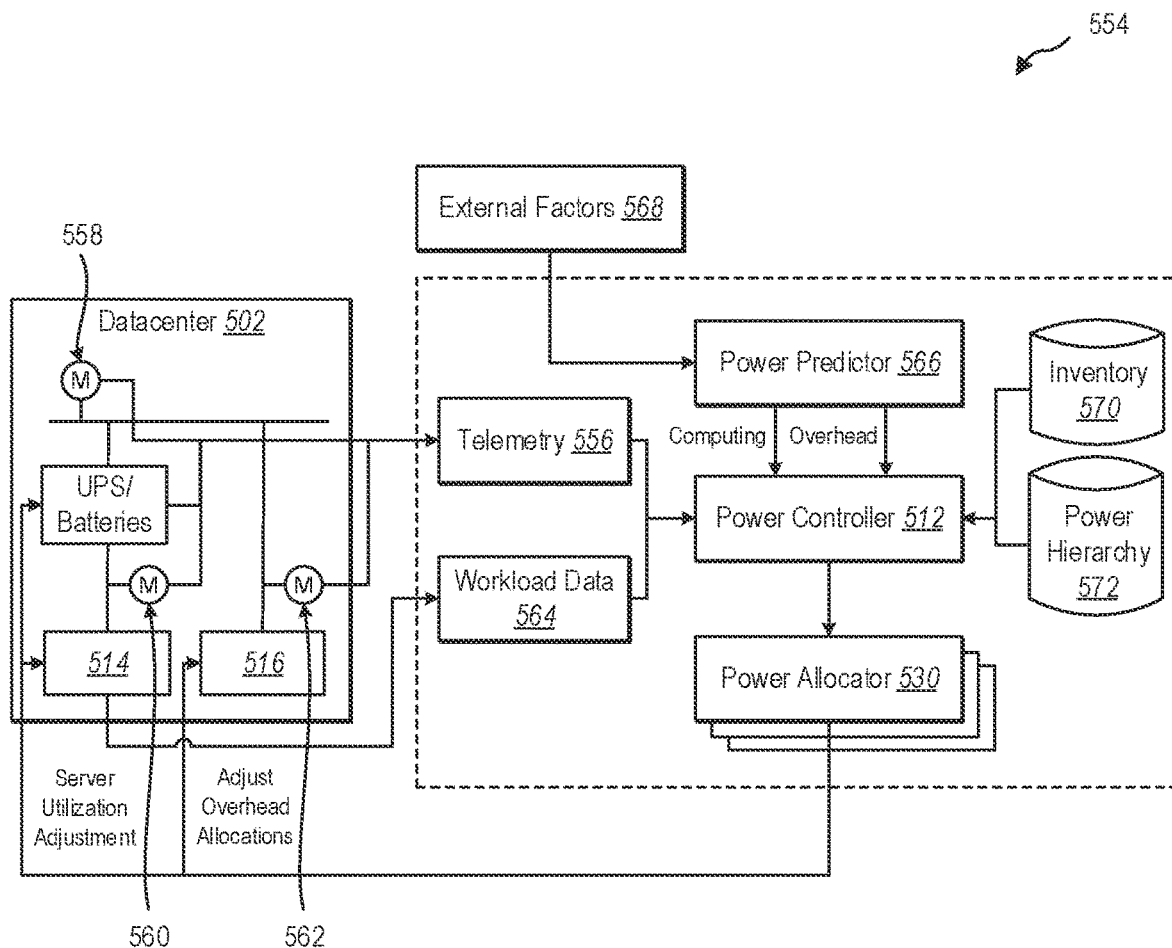

In FIG. 4-5, a power consumption graph 450 shows the power consumption of computing services of a datacenter. As may be seen, the power controller may allocate the computing power 414, overhead power 416, and the power redundancy 432 to power the computing services. In some embodiments, the power redundancy 432 may become unavailable for allocation to computing services for a period of time. As may be seen by the power consumption graph 450, the computing system may be utilizing the power redundancy 432.

When the power redundancy 432 becomes unavailable, the power controller may perform one or more mitigation controls to reduce the power consumption of the computing system to below the maximum power capacity 452. For example, the power controller may throttle computing services, cut power to one or more servers, or otherwise reduce the power consumption of the computing services. This may be followed by a calibration or other period to ensure that the power consumption of the computing system remains below the maximum power capacity 452.

FIG. 5 is a representation of a schematic power allocation system 554 for a datacenter 502, according to at least one embodiment of the present disclosure. A power controller 512 may receive analyze inputs to determine the power uses of the datacenter. The power controller 512 may provide the power use analysis to a power allocator 530. The power allocator 530 may allocate power between computing power 514 and overhead power 516. In some embodiments, the power allocator 530 may allocate power to charging the UPS and/or other batteries that are part of the datacenter 502.

The power controller 512 may receive telemetry 556 regarding the power consumption at the datacenter 502. For example, the telemetry 556 may include measurements from an input power sensor 558, which may measure the input power to the datacenter 502. The telemetry 556 may include measurements from a computing power sensor 560, which may measure the input power to the servers and racks of the datacenter 502. The telemetry 556 may include measurements from an overhead power sensor 562, which may measure the input power to overhead systems. The telemetry 556 may include measurements from the rechargeable elements of the datacenter 502, including the UPS and/or any rechargeable batteries.

Using the telemetry 556, the power controller 512 may analyze the power consumption of the computing system and the overhead systems. In some embodiments, the power controller 512 may further include workload data 564. The workload data 564 may include information regarding the current computing load of the computing system. For example, the workload data 564 may include information regarding the processing operations performed by the servers and computing devices. This may help to further understand the current power consumption of the computing power 514 and/or identify trends in the power consumption.

In some embodiments, the power controller may receive predictive information for future power consumption from a power predictor 566. The power predictor 566 may predict the amount of computing power that may be used by the computing center and/or the amount of overhead power used by overhead systems. For example, the power predictor 566 may determine the predicted computing power based on orders of processing resources from one or more customers, based on historical trends, based on current trends, any other mechanism, and combinations thereof. In some examples, the power predictor 566 may determine the predicted overhead power based on any factor, such as weather, predicted computing load, any other factor, and combinations thereof. In some embodiments, the power predictor 566 may utilize one or more external factors 568, such as weather, power source, and so forth, to predict the computing power and/or the overhead power. The power controller 512 may incorporate the predicted power determinations in its power analysis, and the power allocator 530 may allocate power based on the predicted power.

In some embodiments, the power controller 512 may incorporate other information into the power analysis. For example, the power controller 512 may incorporate an inventory 570 of computing devices. The inventory 570 may include a physical inventory of the amount of servers. The inventory 570 may include an inventory of the processing capacity of individual servers. The inventory 570 may include an inventory of the total processing capacity of the datacenter 502. In some embodiments, the inventory 570 may maintain an inventory of the number of servers that are inoperable or operating at less than full capacity. This may allow the power controller 512 to determine the total available processing capacity of the datacenter 502.

In some embodiments, the power controller 512 may be at least partially influenced by a power hierarchy 572. As will be discussed in further detail herein, a power hierarchy 572 may include a hierarchy of power sources to be used based on certain conditions. For example, the power hierarchy 572 may include instructions for which local power sources to use if the primary power source loses power, including instructions regarding how long after the lost power event to use each source. Different power sources may be situated for different situations. For example, to maintain operation within the first minute of the primary power source losing power, a supercapacitor or other fast-discharging power source may be used. For the short-term, such as between the first minute and the first hour after a power outage, batteries or other power storage elements may be used. For the one hour to 48 hours (or longer), a diesel or other fossil fuel powered generator may be used.

In some embodiments, the power controller 512 may adjust the power hierarchy 572 based on any factor. For example, the power controller 512 may adjust the power hierarchy 572 based on cost of input power, the cost of on-site power, the capital cost of an on-site power source, and so forth. This may help to maintain power continuity while reducing costs. In some embodiments, the power controller 512 may adjust the power hierarchy 572 based on the power allocation and/or the utilization of the computing system.

Figure 6:
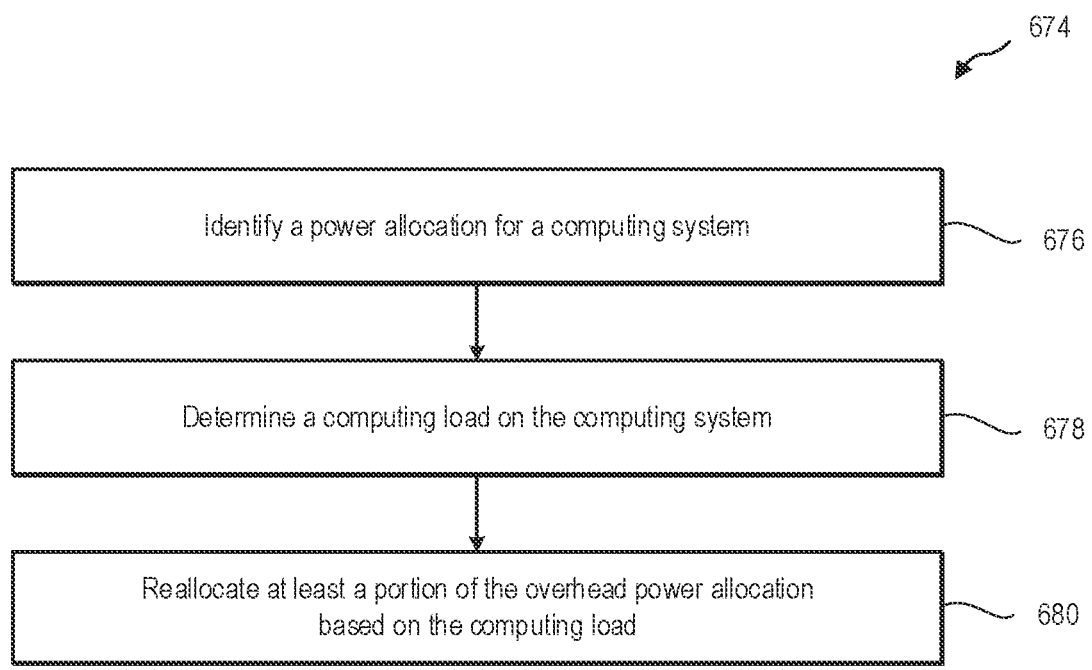
FIG. 6 is a flowchart of a method for power allocation, according to at least one embodiment of the present disclosure.

FIG. 6, the corresponding text, and the examples provide a number of different methods, systems, devices, and non-transitory computer-readable media of the power controller and the power allocation system. In addition to the foregoing, one or more embodiments can also be described in terms of flowcharts comprising acts for accomplishing a particular result, as shown in FIG. 6. FIG. 6 may be performed with more or fewer acts. Further, the acts may be performed in differing orders. Additionally, the acts described herein may be repeated or performed in parallel with one another or parallel with different instances of the same or similar acts.

As mentioned, FIG. 6 illustrates a flowchart of a method 674 or a series of acts for managing power allocation at a datacenter, in accordance with one or more embodiments. While FIG. 6 illustrates acts according to one embodiment, alternative embodiments may one or more of omit, add to, reorder, and modify any of the acts shown in FIG. 6. The acts of FIG. 6 can be performed as part of a method. Alternatively, a non-transitory computer-readable medium can comprise instructions that, when executed by one or more processors, cause a computing device to perform the acts of FIG. 6. In some embodiments, a system can perform the acts of FIG. 6.

A power controller may identify a power allocation for a computing system at 676. For example, the power controller may identify an allocation of power between a computing power allocation, a power redundancy allocation, an overhead power allocation, or combinations thereof. The power controller may determine a computing load on the computing system at 678. For example, the power controller may determine whether the computing load on the computing system is less than, meets, or exceeds the available computing power based on the computing power allocation.

Based on the determined computing load, the power controller may reallocate at least a portion of the overhead power allocation at 680. For example, the power controller may reallocate at least a portion of the overhead power allocation to the computing power allocation, such as when the computing load exceeds the computing power on the computing system. In some examples, the power controller may reallocate at least a portion of the overhead power allocation back to the grid. In this manner, the overhead power allocation may not be unused, thereby improving the power efficiency of the datacenter.

Figure 7:
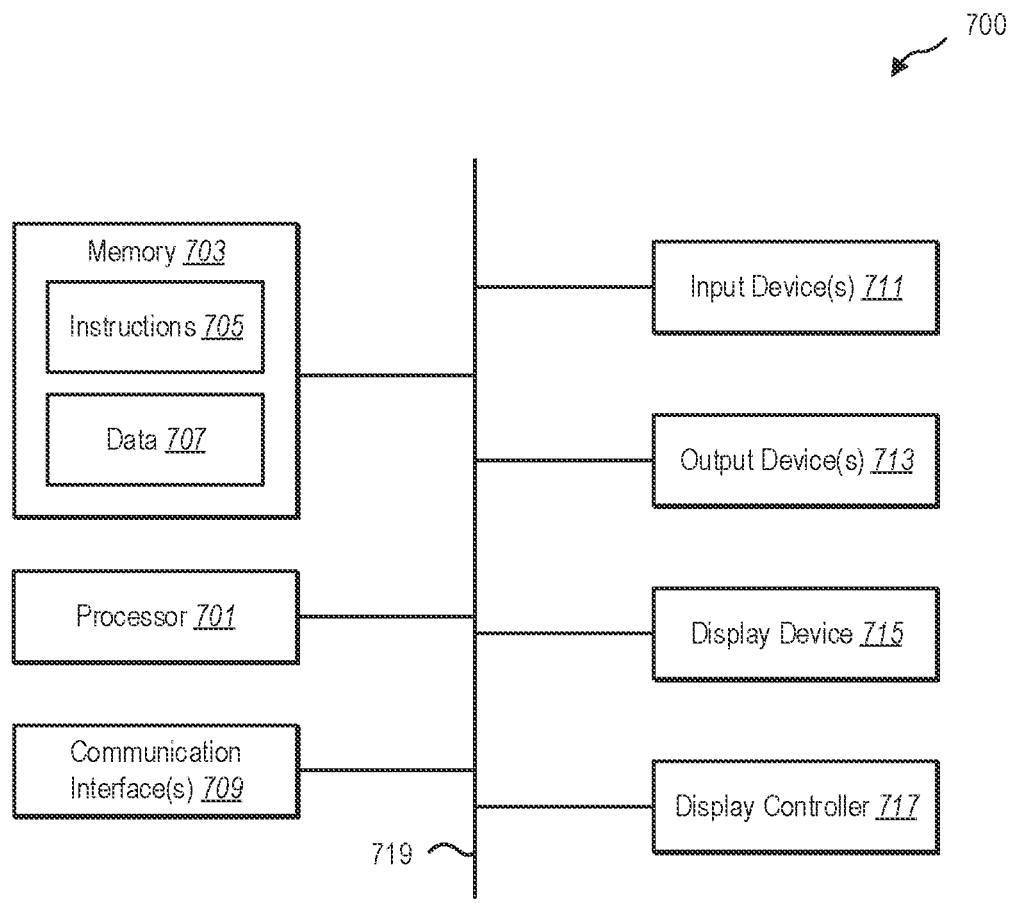
FIG. 7 is a representation of a computing system is a flowchart of a method for power allocation, according to at least one embodiment of the present disclosure.

FIG. 7 illustrates certain components that may be included within a computer system 700. One or more computer systems 700 may be used to implement the various devices, components, and systems described herein.

The computer system 700 includes a processor 701. The processor 701 may be a general-purpose single or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 701 may be referred to as a central processing unit (CPU). Although just a single processor 701 is shown in the computer system 700 of FIG. 7, in an alternative configuration, a combination of processors (e.g., an ARM and DSP) could be used.

The computer system 700 also includes memory 703 in electronic communication with the processor 701. The memory 703 may be any electronic component capable of storing electronic information. For example, the memory 703 may be embodied as random-access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM) memory, registers, and so forth, including combinations thereof.

Instructions 705 and data 707 may be stored in the memory 703. The instructions 705 may be executable by the processor 701 to implement some or all of the functionality disclosed herein. Executing the instructions 705 may involve the use of the data 707 that is stored in the memory 703. Any of the various examples of modules and components described herein may be implemented, partially or wholly, as instructions 705 stored in memory 703 and executed by the processor 701. Any of the various examples of data described herein may be among the data 707 that is stored in memory 703 and used during execution of the instructions 705 by the processor 701.

A computer system 700 may also include one or more communication interfaces 709 for communicating with other electronic devices. The communication interface(s) 709 may be based on wired communication technology, wireless communication technology, or both. Some examples of communication interfaces 709 include a Universal Serial Bus (USB), an Ethernet adapter, a wireless adapter that operates in accordance with an Institute of Electrical and Electronics Engineers (IEEE) 802.11 wireless communication protocol, a Bluetooth© wireless communication adapter, and an infrared (IR) communication port.

A computer system 700 may also include one or more input devices 711 and one or more output devices 713. Some examples of input devices 711 include a keyboard, mouse, microphone, remote control device, button, joystick, trackball, touchpad, and lightpen. Some examples of output devices 713 include a speaker and a printer. One specific type of output device that is typically included in a computer system 700 is a display device 715. Display devices 715 used with embodiments disclosed herein may utilize any suitable image projection technology, such as liquid crystal display (LCD), light-emitting diode (LED), gas plasma, electroluminescence, or the like. A display controller 717 may also be provided, for converting data 707 stored in the memory 703 into text, graphics, moving images, or combinations thereof (as appropriate) shown on the display device 715.

The various components of the computer system 700 may be coupled together by one or more buses, which may include a power bus, a control signal bus, a status signal bus, a data bus, etc. For the sake of clarity, the various buses are illustrated in FIG. 7 as a bus system 719.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method for allocating power, comprising:
    determining a power allocation for a computing system, the power allocation including a computing power allocation, a power redundancy allocation, and an overhead power allocation between a plurality of overhead systems;
    determining a computing load on the computing system;
    reallocating at least a portion of the overhead power allocation for an overhead system of the plurality of overhead systems based on the computing load; and
    receiving a request for additional computing capacity, and wherein reallocating at least the portion of the overhead power allocation for the overhead system of the plurality of overhead systems includes reallocating at least a portion of the power redundancy allocation and at least the portion of the overhead power allocation to the computing power allocation by suspending one or more of the plurality of overhead systems to increase a computing capacity based on the request for the additional computing capacity.

2. The method of claim 1, wherein reallocating at least the portion of the overhead power allocation includes reallocating at least the portion of the overhead power allocation to a power grid.

3. The method of claim 1, wherein reallocating at least the portion of the overhead power allocation includes suspending power to a suspended overhead system of the plurality of overhead systems.

4. The method of claim 3, wherein suspending the power to the suspended overhead system includes suspending the power to a computing cooling system.

5. The method of claim 3, wherein suspending the power to the suspended overhead system includes suspending the power to lighting and HVAC.

6. A power allocation system for a datacenter, comprising:
    one or more computing systems having a computing capacity;
    an input power source;
    a power controller connected to the input power source and configured to allocate input power provided by the input power source between a computing power allocation and an overhead power allocation, the power controller configured to:
        allocate the input power to the computing power allocation by providing the input power to the one or more computing systems, a first portion of the input power being allocated for computing power of the one or more computing systems and a second portion of the input power being allocated for backup power; and
        allocate the input power to the overhead power allocation by providing the input power to a plurality of overhead systems; and
    wherein the power controller is further configured to reallocate at least a portion of the input power allocated to the overhead power allocation to the computing power allocation based on a request for additional computing capacity of the one or more computing systems, wherein at least the portion of the input power allocated to the overhead power allocation is allocated for power losses, and wherein the power controller is configured to reallocate at least the portion of the input power allocated for the power losses by suspending one or more of the plurality of overhead systems based on an increase in power consumption of the one or more computing systems to increase the computing capacity of the one or more computing systems.

7. The power allocation system of claim 6, wherein the input power allocated to the overhead power allocation includes an allocation for a computing cooling system for the one or more computing systems, and wherein the power controller is configured to reallocate power from the allocation for the computing cooling system to the computing power allocation based on the additional computing capacity.

8. The power allocation system of claim 6, wherein the power controller is configured to reallocate a portion of a stored back up power to a grid.

9. A system for allocating power, comprising:
    a power controller including a memory; and
    a processor, the processor including instructions which cause the processor to:
        determine a power allocation for a computing system, the power allocation including a computing power allocation, a power redundancy allocation, and an overhead power allocation between a plurality of overhead systems;

determine a computing load on the computing system; and reallocate at least a portion of the overhead power allocation for an overhead system of the plurality of overhead systems based on the computing load; and receive a request for additional computing capacity, and wherein reallocating at least the portion of the overhead power allocation for the overhead system of the plurality of overhead systems includes reallocating at least a portion of the power redundancy allocation and at least the portion of the overhead power allocation to the computing power allocation by suspending one or more of the plurality of overhead systems to increase a computing capacity based on the request for the additional computing capacity.

10. The system of claim 9, wherein reallocating at least the portion of the overhead power allocation includes reallocating a portion of a stored backup power to a power grid.

11. The system of claim 9, wherein the instructions further cause the processor to receive the request for additional computing capacity, and wherein reallocating at least the portion of the overhead power allocation includes reallocating the portion of the overhead power allocation to the computing power allocation.

12. The system of claim 9, wherein the instructions further cause the processor to determine a predicted computing power, and wherein determining the power allocation includes determining the power allocation based on the predicted computing power.

13. The system of claim 12, wherein determining the predicted computing power includes determining the predicted computing power based on one or more of orders of processing resources, historical trends, or current trends.

14. The system of claim 9, wherein the instructions further cause the processor to determine an input source for the computing system, wherein determining the input source is based on a hierarchy of power sources.

* * * * *